(12) United States Patent
Muhammad et al.

(10) Patent No.: US 8,810,286 B1
(45) Date of Patent: Aug. 19, 2014

(54) METHOD AND APPARATUS FOR SYNTHESIZING A LOW PHASE NOISE FREQUENCY WITH WIDE TUNING RANGE

(71) Applicant: MStar Semiconductor, Inc., Chupei (TW)

(72) Inventors: Khurram Muhammad, Garland, TX (US); Chih-Ming Hung, HsinChu (TW)

(73) Assignee: Mstar Semiconductor, Inc., Hsinchu (TW)

( * ) Notice: Subject to any disclaimer, the term of this patent is extended or adjusted under 35 U.S.C. 154(b) by 0 days.

(21) Appl. No.: 13/875,829

(22) Filed: May 2, 2013

(51) Int. Cl.
*H03K 19/082* (2006.01)
*H03K 19/094* (2006.01)
*H03L 7/16* (2006.01)

(52) U.S. Cl.
CPC .................................. *H03L 7/16* (2013.01)
USPC .......................................... 327/105; 327/107

(58) Field of Classification Search
CPC ............ H03B 21/02; H03L 7/18; H03L 7/16; H03L 7/23; G06F 1/025
USPC ................... 327/105–107, 156, 158
See application file for complete search history.

(56) References Cited

U.S. PATENT DOCUMENTS 8,082,285 B2 * 12/2011 Simmonds .................... 708/276
2008/0238495 A1 * 10/2008 Tachibana et al. ............ 327/105

\* cited by examiner

*Primary Examiner* — Lincoln Donovan
*Assistant Examiner* — Diana J Cheng
(74) *Attorney, Agent, or Firm* — Oliff PLC (57) ABSTRACT

Direct digital frequency synthesis is the process by which a digital frequency synthesizer component may output a stable, precise clock frequency at any of a broad range of possible frequency output values for any number of applications, usually across an integrated circuit. The digital frequency synthesizer set forth in this disclosure is a combination of a controller configured to receive a frequency control word and generate a first frequency control sub-word and a second frequency control sub-word based on the frequency control word, a frequency generator configured to generate a source frequency within a first predetermined frequency range based on the first frequency control sub-word, and a variable frequency divider configured to generate an output frequency within a second predetermined range based on the second frequency control sub-word and the source frequency.

18 Claims, 6 Drawing Sheets

METHOD AND APPARATUS FOR SYNTHESIZING A LOW PHASE NOISE FREQUENCY WITH WIDE TUNING RANGE

BACKGROUND

Direct digital frequency synthesis (DDS) is the process by which a digital frequency synthesizer component may output a stable, precise clock frequency at one of a broad range of possible frequency output values for any number of applications, usually across an integrated circuit chip.

In the past, combination analog-digital integrated circuits were either prohibitively expensive, of poor quality, or simply non-existent. However, recent advances in semiconductor processing and manufacture, such as CMOS, BiCMOS, Silicon on insulator (CMOS SOI) and SiGe have made economical, high-quality mixed-signal circuits a reality. More importantly, deep-submicron CMOS has allowed integration to unprecedented levels with single chip radios that include RF, analog, MODEM, applications processor, memory and peripheral interfaces, all on a single IC. Second generation cellular communication and onwards have placed increased demands on digital frequency synthesizers due to their stringent phase noise requirement, tuning range and band coverage especially for fourth generation cellular standard commonly referred to as LTE. One resolution bottleneck relates to the quality of the output signal produced by the frequency synthesizer demanding very stringent phase noise in low-voltage CMOS processes. Accordingly, novel circuit designs and approaches are needed to improve the output signal quality of digital frequency synthesizers, which translates into more stringent requirements for lower phase noise in the output signal and larger tuning bandwidth across multiple bands.

SUMMARY

Digital frequency synthesis is a crucial ingredient of modern wireless communications systems, and has been implemented as a low-cost, high-reliability variable frequency signal source in applications ranging from mobile phones and wireless digital radios (such as routers and modems) to GPS receivers and even SATCOM components. It is an object of the present invention to provide a high-quality digital frequency synthesizer capable of generating a low-noise frequency output tunable over a very broad frequency range. To accomplish this, a frequency generator with a large quality factor (Q), low-noise, and as a result, narrow tuning range (in an embodiment, ~5%) is used in conjunction with a fractional-N variable frequency divider with a broad tuning range. The combination results in a desired low-noise broad band digital frequency synthesizer.

An obstacle to the implementation of this "dual component" approach to frequency synthesis is integration within the existing framework. Typical frequency synthesizers operate solely on the basis of a single frequency control word. However, in preferred embodiments both the frequency generator and the variable frequency divider are controlled independently. To accomplish this task, the original frequency control word is analyzed and/or deconstructed. In its place, frequency control sub-words are generated, each sub-word directed to a particular component (i.e., the variable frequency divider). Accordingly, a controller is introduced into the architecture to perform the generation of the frequency control sub-words from the original frequency control word.

In some cases, the frequency control sub-word may already be a part of the original frequency control word, in which case the controller may simply partition the original frequency control word into two or more portions and designate one or more of the portions as the frequency control sub-word(s). In other cases, it may be necessary to first perform arithmetic and/or logic operations on the original frequency control word (depending on its format) to determine the desired output frequency of the digital frequency synthesizer. Once the output frequency is determined, it may then be necessary to further encode the frequency control sub-words to match their respective implementations. In a worst-case scenario, it may be necessary to perform a different encoding scheme for each of the individual frequency generator and variable frequency divider components.

For example, the original frequency control word may be represented as a ranged value, such as between 0 and $2^N$, with 0 indicating the lowest possible frequency output and $2^N$ being the highest. Once the output frequency represented by the value of the frequency control word is discerned, frequency control sub-words need to be generated for the frequency generator and the variable frequency divider. These may each also require ranged values (but within different ranges), which may then be calculated. However, there may be other encoding schemes which instruct the components to generate the appropriate frequencies. For example, one frequency control sub-word may simply be the exact value of output frequency it is to generate (in hexadecimal), while the other frequency control sub-word may be a series of state-change/delay instructions, such as (0, 0, 1, 0, 0, 1 . . . )→(delay, delay, change state, delay, delay, change state). The controller is thus configured to generate the frequency control sub-words based on the original frequency control word as appropriate to the application being addressed.

BRIEF DESCRIPTION OF THE DRAWINGS

Various embodiments of the disclosure that are proposed as examples will be described in detail with reference to the following figures, wherein like numerals reference like elements, and wherein.

DETAILED DESCRIPTION OF THE EMBODIMENTS

Figure 1:
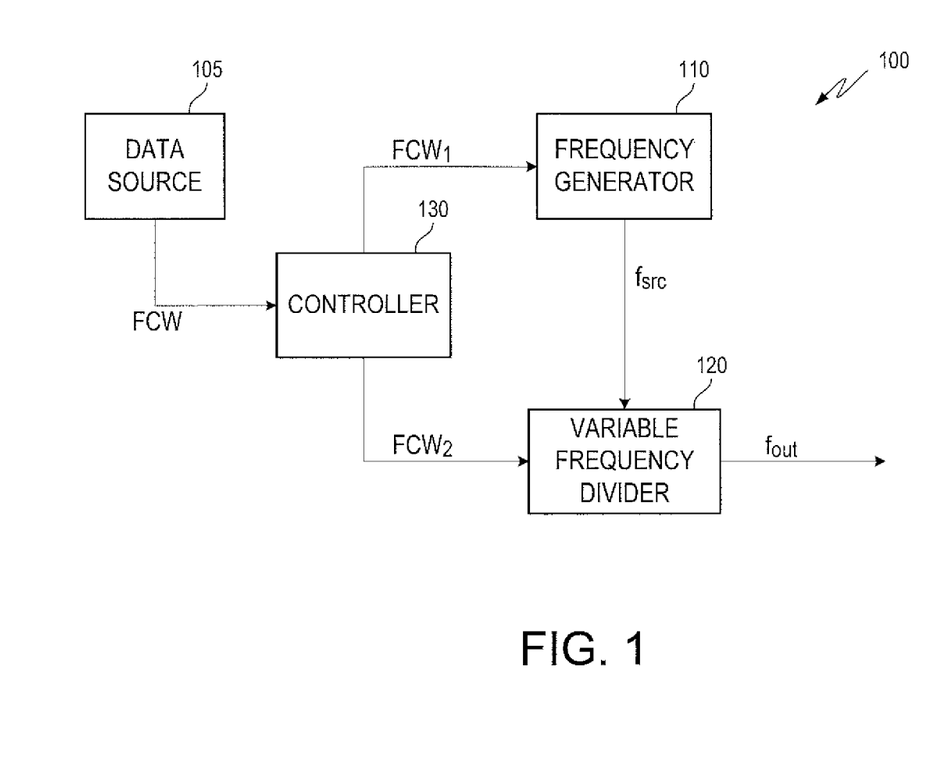
FIG. 1 shows an exemplary block diagram of a digital frequency synthesizer 100 according to an embodiment of the disclosure.

FIG. 1 is an exemplary block diagram of a digital frequency synthesizer 100 according to an embodiment. As shown in FIG. 1, the digital frequency synthesizer 100 can include a frequency generator 110, a variable frequency divider 120, and a controller 130. Further, data source 105 supplies data, such as a frequency control word FCW, to an input of the controller 130. Outputs of the controller 130 are coupled to control inputs of the frequency generator 110 and the variable frequency divider 120 via data lines. A signal output of the frequency generator 110 is coupled to a signal input of the variable frequency divider 120, and the signal output of the variable frequency divider 120 is the digital frequency synthesizer 100 output.

The controller 130 can be any device that converts a frequency control word FCW into first and second frequency control sub-words $FCW_1$ and $FCW_2$. As shown in FIG. 1, the controller 130 receives, as an input, the frequency control word FCW generated by data source 105. The controller 130 can execute an operation on the FCW, such as a logic, to generate the first and second frequency control sub-words $FCW_1$ and $FCW_2$ from the input frequency control word FCW provided by the data source 105. The controller 130 can subsequently transmit the first and second frequency control sub-words $FCW_1$ and $FCW_2$ to the frequency generator 110 and variable frequency divider 120, respectively.

The frequency generator 110 can be any device capable of generating a source frequency $f_{src}$ based on the frequency control sub-word $FCW_1$. In an embodiment, the frequency generator 110 is a phase-locked loop with an reasonable quality factor (Q) necessary to guarantee low phase noise at its output, as required by the standard. Accordingly, frequency generator 110 exhibits relatively little phase noise. As a consequence of the high quality factor, however, the range of tunable frequencies that can be generated by frequency generator 110 may be limited. For example, the range of tunable frequencies may be limited to + or −2.5% of some voltage controlled oscillator (VCO) center frequency. Thus, for a VCO center frequency of 1 GHz, for example, the output frequency $f_{src}$ from frequency generator 110 may only take on values from 0.975 GHz to 1.025 GHz. The precise value of $f_{src}$ within this range is determined by $FCW_1$. Selection of relatively high Q causes the tuning range to reduce. The tuning range can be increased by using a programmable capacitor (as selectable capacitors in a capacitor bank) in the tank circuit, however, the quality factor degrades as each capacitor in the tank circuit degrades the effective Q-factor of the tank circuit.

The variable frequency divider 120 can be any device that generates an output frequency $f_{out}$ based on the frequency control sub-word $FCW_2$ and the source frequency $f_{src}$. Compared to the frequency generator 110, which has a restricted tuning range, the variable frequency divider 120 can implement a broad tuning range. In an embodiment, the variable frequency divider 120 selects signals from a signal source in a particular sequence such that the source frequency $f_{src}$ is first virtually (not physically) multiplied by an integer N, which is determined by the hardware implementation of variable frequency divider 120, and then divided by a configurable integer D (120). $FCW_2$ determines the precise value of $f_{out}$ within the broad frequency tuning range provided by variable frequency divider 120. Accordingly, $FCW_2$ determines the value of D. In this embodiment, the output frequency $f_{out}$ of variable frequency divider 120 is equal to the source frequency $f_{src}$ multiplied by N/D. In other words, $f_{out}=f_{src}*N/D$. However, $f_{src}*N$ is realized by passing the input $f_{src}$ through a delay chain and selecting an appropriately delayed version of $f_{src}$.

In one embodiment, N=64 and D is any integer between 24 and N (=64). This wide range of possible values of D, which may be configured via $FCW_2$, can result in a broad output frequency tuning range. In this way, the digital frequency synthesizer 100 achieves low phase noise (via the high Q-factor of frequency generator 110) combined with a broad output frequency range (via the wide range of values of D). For example, $f_{src}$ may range only from 0.975 GHz to 1.025 GHz. However, taking N=64 as an example, the total range for the digital frequency synthesizer output 100 would be from $f_{out,lower}$=(0.975)*(64)/(64)=0.975 GHz to $f_{out,upper}$=(1.025)*(64)/(24)=2.73 GHz, or ≈2.8 octaves.

As described above, upon receipt of the first sub-word ($FCW_1$), the frequency generator 110 outputs a corresponding source frequency ($f_{src}$) which is generated within some limited, predetermined frequency range with comparatively low phase noise due to the high Q-factor of frequency generator 110. For the purposes of this embodiment, assume a VCO center frequency of $f_{src}$=1.56 GHz.

Upon receipt of the second sub-word ($FCW_2$), the variable frequency divider 120 selects signals according to a particular sequence such that the output frequency equals the source frequency $f_{src}$=1.56 GHz multiplied by a first integer N (which is a property of variable frequency divider 120) and divided by a second integer D, determined by $FCW_2$. The result of the operations is the digital frequency synthesizer output $f_{out}=N*f_{src}/D$. Therefore, in the above embodiment with $f_{src}$=1.56 GHz, N=64 and D=25, $f_{out}$=4 GHz.

By using the digital frequency synthesizer 100 as described above, $f_{out}$ can be generated at any number of frequencies, based on the original frequency control word FCW and accordingly by the derived frequency control sub-words $FCW_1$ and $FCW_2$. Below, it will be shown that, although D is strictly limited to integers, the time average of D may approximate non-integer values, such as D=30.02.

The above embodiment also demonstrates a very useful property of the digital frequency synthesizer 100: that a single desired output frequency $f_{out}$ may result from different combinations of the frequency control sub-words $FCW_1$ and $FCW_2$, i.e., from different combinations of source frequency $f_{src}$ and D. This allows the source frequency $f_{src}$ to be effectively moved away from an unforeseen subsequent operational load frequency to combat voltage controlled oscillator (VCO) "pulling".

"Pulling," as will be familiar to those skilled in the art, occurs when an oscillator suddenly experiences an impedance mismatch. This causes the oscillator to deviate from its operating frequency in response to the change in load impedance. An alternative view of VCO pulling is to describe it as an aggressing signal coupling from another node with large output power (e.g. PA output) to the input of the VCO through a parasitic coupling path. This aggressing signal causes the VCO output to follow the aggressing signal. For example, to synthesize a desired output frequency of $f_{out}$=2 GHz, a first design choice for D may be 32, which for N=64 implies that $f_{src}$=1 GHz. However, it is possible that a further divide-by-2 stage is added to the output of the variable frequency divider 120, resulting in a second operational frequency of 1 GHz in the signal chain. In this circumstance, the VCO will be particularly sensitive to small deviations in the second 1 GHz operational load frequency. However, $f_{src}$ may be moved away from this frequency by instead selecting D=33, implying a new source frequency of $f_{src}$=1.03 GHz which is 30 MHz away from the second 1 GHz operational load frequency and still within a ~5% overall VCO tuning range. Alternatively stated, the oscillator is better isolated from the load.

Figure 2:
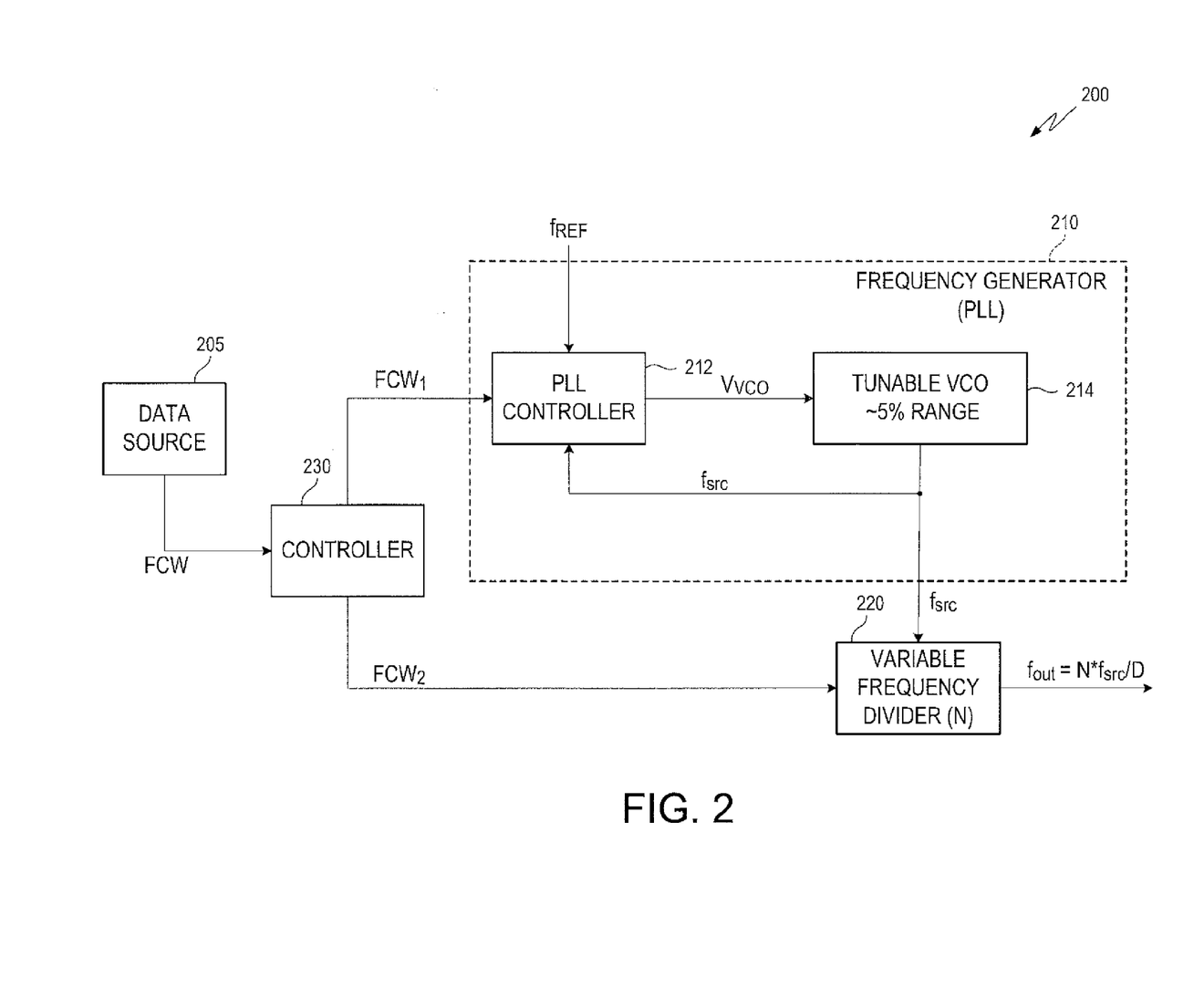
FIG. 2 shows an exemplary block diagram of a frequency generator 210 in greater detail.

FIG. 2 is a block diagram of a digital frequency synthesizer 200 showing a frequency generator 210 in greater detail. In FIG. 2, the frequency generator 210 includes a phase-locked loop (PLL) controller 212 and a tunable voltage controlled oscillator (VCO) 214. The frequency generator 210 accepts as inputs a stable, external reference frequency $f_{REF}$ and frequency control sub-word $FCW_1$ to generate the source frequency $f_{src}$. The PLL controller 212 phase locks the reference signal with the source frequency signal, and controls the VCO voltage $V_{VCO}$ to generate the source frequency signal at a frequency $f_{src}$ within some percentage (5% in an embodiment) of the VCO 214 operational center frequency based on the frequency control sub-word $FCW_1$. The tunable oscillator 214 then generates $f_{src}$ either directly (by directly tuning an internal high-frequency VCO) or indirectly (by tuning a low-frequency VCO and performing digital frequency multiplication). The actual value of $f_{src}$ within the predetermined first frequency range (tuning range) is based on the desired source frequency $f_{src}$ represented in $FCW_1$. The tuned frequency $f_{src}$ is output by the frequency generator 210, and is transmitted to the signal input of variable frequency divider 220. The tuned frequency $f_{src}$ can also be fed back into the PLL controller 212 creating a negative feedback loop.

In one embodiment, $f_{src}$ has a duty cycle of no greater than 50%, preferably 25%. Accordingly, if $f_{src}$ has a duty cycle above this value it is preferable to include a divide-by-2 or other suitable component before inputting $f_{src}$ into the variable frequency divider 220 so as to reduce the duty cycle to the preferred range. As described in greater detail below, one reason for this is because the duty cycle places a limit on the smallest value of D that is possible, which is why D=24 in a previous example, and not 1. For this reason, with a 50% divide value D can be no smaller than 33. At a 25% duty cycle, however, the minimum value of D is reduced to 17, which enables the designed to employ a considerably wider tuning range. In either case, there is no impact on the largest value of D, which equals "N" of the variable frequency divider 220 (typically N=64).

As previously discussed, the restrictive (~5%) tuning range of the tunable oscillator (VCO) 214 driving the frequency generator 210 is a trade-off for the comparatively high quality factor (Q) exhibited by the digital frequency synthesizer 200. This high Q-factor results in a relatively small amount of phase noise contributed by the source frequency $f_{src}$ to the digital frequency synthesizer 100 output. As a result, the phase noise in the digital frequency synthesizer 100 output is minimized. As discussed below, the sacrifice in tuning range of $f_{src}$ at frequency generator 210 can be restored later by the broad tuning range achieved by the variable frequency divider 220.

Figure 3A:
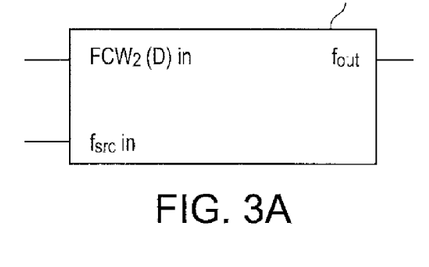
FIGS. 3A-3C show block diagrams of a variable frequency divider 320 in three levels of detail.
Figure 3B:
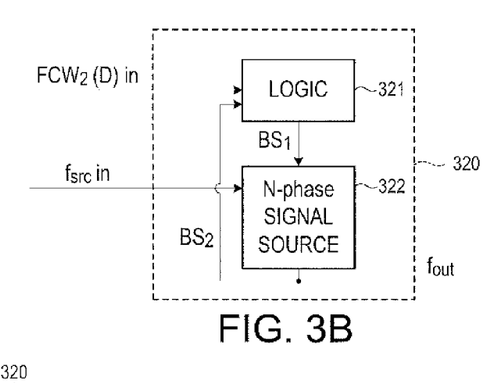
Figure 3C:
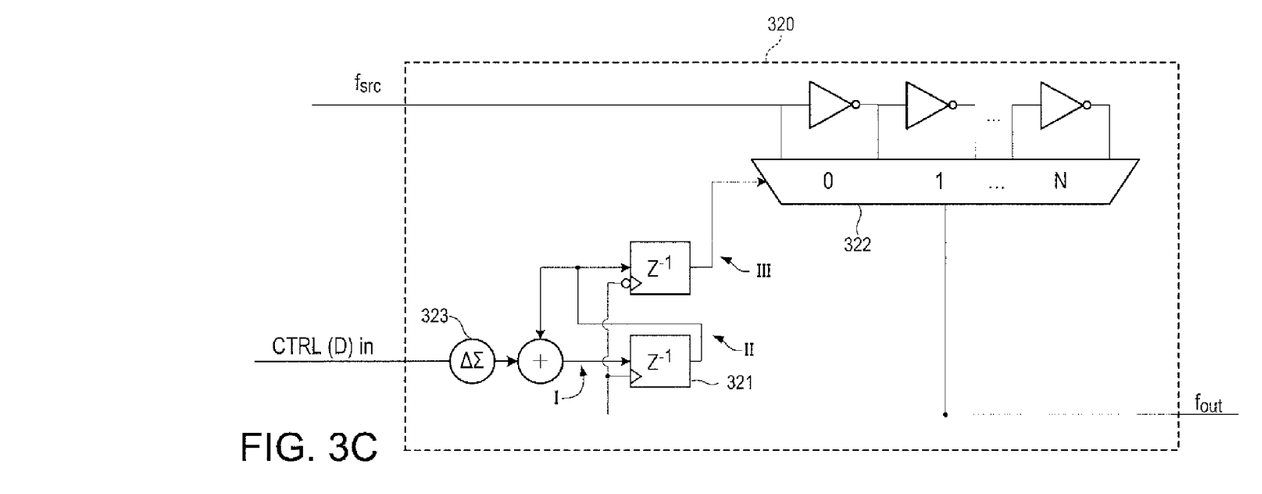

FIGS. 3a-3c illustrate progressively greater levels of detail for the variable frequency divider 320. FIG. 3a shows a generic Integer-N or Fractional-N digital frequency divider employing a multi-phase (N-phase) clock, which those of skill in the art will recognize as a commercially available off-the-shelf (C.O.T.S.) component. The variable frequency divider 320 generates an output frequency $f_{out}$ based on the frequency control sub-word $FCW_2$ and the source frequency $f_{src}$. FIGS. 3b and 3c each show an embodiment of the variable frequency divider 320 as further described in U.S. patent application Ser. No. 13/875,706, filed on May 2, 2013, entitled "METHOD AND APPARATUS FOR PROGRAMMABLE FREQUENCY DIVIDER", which is incorporated herein by reference in its entirety.

As described in greater detail below, the variable frequency divider 320 of FIG. 3b generates $f_{out}$ based on inputs $f_{src}$ and $FCW_2$ by way of a digital control loop. FIG. 3c provides yet further detail as to the generation of $f_{out}$ as a function of $f_{src}$, N, and D, where N and D are integers determined by the variable frequency divider 320 hardware implementation (which determines N) and the second frequency control word $FCW_2$ (which determines D). FIG. 3c shows the actual components constituting the logic 321 and the N-phase signal source 322, and further introduces the delta-sigma modulator 323 described later.

As shown in FIGS. 3b-3c, the variable frequency divider 320 may include logic 321 and an N-phase signal source 322 configured in a digital control loop. Logic 321 further includes sequential logic components such as flip-flops (or other unit delay devices), an arithmetic logic unit (ALU), and the like. The N-phase signal source 322 further can include N identical phase delay components (e.g. buffers), a multiplexer, and optionally a modulation unit.

Referring again to FIG. 3b, the N-phase signal source 322 takes $f_{src}$ as an input and generates N phase delayed copies of $f_{src}$. Thus, in an embodiment with N=64, the N-phase signal source 322 may generate 64 different copies of $f_{src}$. Since a full period is 360°, each consecutive copy is 360°/64=5.625° phase delayed from the previous copy. Each copy is then input into a multiplexer, and is available for individual selection by logic 321. One way of accomplishing this can be to pass $f_{src}$ through a series of N identical phase delay elements, such as inverters (as illustrated in FIG. 3c), and use feedback to connect the endpoints to assure the full 360° phase is evenly divided over each element. Each inverter output could then serve as an input to and a selectable output from the multiplexer.

The logic 321 performs the frequency synthesis operation. One technique to generate an arbitrary frequency $f_{out}$ based on $f_{src}$ and frequency control sub-word $FCW_2$ is as follows. Assume one cycle of $f_{src}$ includes a single clock pulse occurring somewhere in the cycle, and that this pulse occurs at the very beginning of the cycle for the copy of $f_{src}$ with 0° phase delay. Following the pulse, the signal stays at logic '0' until the full cycle has completed (360°), at which point the process completes. The corresponding pulse for each respective phase delayed copy of $f_{src}$ occurs at a different fraction of the cycle equal to its phase delay divided by 360°, and is '0' everywhere else. For example, a pulse occurring halfway through the cycle would begin and end with logic '0', and would have a brief pulse (logic '1') at 180° in the middle of the cycle.

Logic 321 takes the current output signal from the N-phase signal source 322 (as current bit stream $BS_2$) and the frequency control sub-word $FCW_2$, and based on an arithmetic calculation involving each (for instance, binary addition), determines the next output from the N-phase signal source 322. This signal will be the next input bit stream $BS_2$ to logic 321. The address of this next signal is transmitted to the N-phase signal source 322 as bit stream $BS_1$ when the negative edge of the pulse is detected (i.e., as soon as the pulse ends), and the next pulse (from this address) is immediately generated by the N-phase signal source 322 and applied to logic 321 as the new current bit stream $BS_2$. This process repeats indefinitely, with $f_{out}$ for the digital frequency synthesizer 100 taken from the N-phase signal source 322 as illustrated in FIGS. 3b-3c.

To see how $FCW_2$ is used to generate the broad range of tunable frequencies, specific embodiments of frequency generation are described below. For a first embodiment, assume input bit stream $BS_2$ is $f_{src}$ at 0° phase delay, and $FCW_2$ contains information indicating that the lowest possible frequency is to be generated by the logic 321. Logic 321 would process the combination of $FCW_2$ with $f_{src}$ at 0° phase, and would conclude that the next signal address that should be selected from the N-phase signal source 322 is the address of the signal corresponding to $f_{src}$ at 0° phase delay. That is, the same signal. As soon as the pulse ends, logic 321 would then "re-select" the same signal.

The reason for logic 321 to re-select the same signal in order to achieve the lowest frequency is because, since the "pulse" portion of the signal $f_{src}$ at 0° just occurred (and won't occur again until the start of the next cycle), the "new" signal (which is the original signal) will simply stay at logic '0' until the next pulse occurs. If logic 321 had selected any other pulse, there would have been a shorter delay until the next pulse (meaning a higher frequency), because every other pulse must occur once (and only once) before the end of the current cycle. Only the same pulse, $f_{src}$ at 0°, will not occur again during this cycle, and thus will have the longest delay of all the possible signals until the next pulse. This translates into generating the lowest frequency at $f_{out}$ for the digital frequency synthesizer 100, which it turns out is simply $f_{src}$:

$$f_{out,min} = f_{src} \qquad \text{Eq. (1)}$$

As a second embodiment, assume $BS_2$ is $f_{src}$ at 0° phase delay, but now $FCW_2$ contains information indicating that the highest possible frequency is to be generated by the logic 321. This time, logic 321 combines $FCW_2$ with $f_{src}$ at 0° and concludes that the very next available frequency, corresponding to $f_{src}$ at 5.625° phase delay, will be selected. Unlike in the above case, this pulse has not yet occurred, but is just about to. Thus, there is a very brief delay in $f_{out}$ followed almost immediately by a second pulse. At the end of this second pulse, the process is immediately repeated with the next selected pulse being the very next available frequency (again), which corresponds to $f_{src}$ with 2*5.625°=11.25°. As this process repeats, each possible output signal from the N-phase signal source 322 is consecutively selected without omission following the termination of each signal pulse. At the end of 1 cycle of $f_{src}$, all 64 copies have each contributed a pulse to $f_{out}$. Thus, a single cycle of $f_{src}$ generates 64 pulses at $f_{out}$, or $f_{out}=64*f_{src}$. In general, for N selectable signals, the highest possible output frequency is $N*f_{src}$:

$$f_{out,max} = N*f_{src} \qquad \text{Eq. (2)}$$

Combining equations (1) and (2) with a variable tuning range of X % from the frequency generator 210, we can define a ratio of tuning ranges between the second and first predetermined frequency ranges. The tuning range of the second predetermined frequency range is $f_{out, max} - f_{out, min} = N*f_{src} - f_{src} = f_{src}(N-1)$. The tuning range of the first predetermined frequency range is $f_{src, max} - f_{src, min} = (f_{src} + X\ \%*f_{src}) - (f_{src} - X\ \%*f_{src}) = 2*f_{src}*X\ \%$. Accordingly, the ratio of tuning ranges is $f_{src}(N-1)/2*f_{src}*X\ \% = (N-1)/2*X\ \%$.

$$(f_{out,max} - f_{out,min})/(f_{src,max} - f_{src,min}) = (N-1)/2*X\ \% \qquad \text{Eq. (3)}$$

Accordingly, for N=64, this quantity=31.5/X %.

In practice, it is not generally of interest to operate at the highest possible frequency. The above examples illustrate how any number of frequencies may be generated according to $FCW_2$. The phase delayed copies of $f_{src}$ are selected in sequence according to the desired output frequency represented in $FCW_2$. Thus, the process of frequency generation may be abstracted as dividing the largest possible frequency $N*f_{src}$ by an integer D determined by the frequency control sub-word $FCW_2$. For example, by selecting every other available signal in the above example, the output frequency would be $32*f_{src}=(64/2)*f_{src}$. Accordingly, the term variable frequency divider is given to element 320 because it divides a frequency value, in this case $N*f_{src}$, to get a desired output frequency. It is emphasized that $N*f_{src}$ is synthesized due to multiple edges being available at the input of the multiplexer (322) and not through a physical multiplier.

While the above embodiments illustrate only the lowest and highest attainable frequencies, it should be understood that the device operation may be extrapolated from these to infer how any number of intermediate frequencies may be generated based on frequency control sub-word $FCW_2$.

In the case of the variable frequency divider 320 illustrated in FIG. 3c, it is further worth noting the logic 321 employs both positive and negative edge triggered unit delay components connected in parallel. With this configuration, operations can be performed twice during the course of a pulse once during the positive pulse edge, and once during the negative edge of the same pulse. Briefly, the operation of this circuit will be described.

For the circuit illustrated in FIG. 3c, the positive edge delay element and negative edge delay element form three distinct logic nodes. Node 'I' holds the logic value of a calculation of $FCW_2$ and a feedback value before the unit delay elements. This value is a signal address from the N-phase signal source 322. Node II holds the logic value of a calculation between the delay elements, and also provides the feedback value used in the calculation of node I. Node III holds the logic value after the delay elements, and is the address transmitted to the N-phase signal source. Assume a previous pulse (pulse 1) has already occurred. Just before the next pulse (pulse 2), node I already holds the address of pulse 3. During the positive edge of pulse 2, the value of node I (the address of pulse 3) moves into node II, and this new value at node II is fed back into the summer (along with $FCW_2$) to create a new value at node I (this value is the address of pulse 4). Nothing happens at node III until pulse 2 ends (negative trigger), at which point node II moves into node III, which now holds (and transmits to the N-phase signal source 322) the address of pulse 3. The circuit is now in the same state as it began—pulse 3 is about to occur, and node I is already holding the address of pulse 4. In this way, the circuit is stays one address ahead of the clock. This operation is possible because the complimentary delay elements execute two operations per pulse; once on the positive signal edge, once on the negative signal edge.

The delay stages in the divider 322 can be implemented using differential inverters using a differential multiplexer in which even outputs are inverted at the input of the multiplexer. Alternatively, the delay stages can be implemented with single ended inverters and a multiplexer. Two inverters in series can implement a single delay stage. Many circuit configurations are possible to realize a delay chain with a selectable output.

A further property of variable frequency divider 320 is that it is capable of emulating non-integer values of D (via $FCW_2$) by time-averaging full integer values. For example, D may be approximated at a value of 30.02 by setting D=30 for 98 cycles and D=31 for 2 cycles. This information may be contained entirely in $FCW_2$ or may be communicated by consecutively transmitting differing $FCW_2$'s, each representing a single value of D. The ability to emulate fractions of a value makes variable frequency divider 320 a fractional variable frequency divider.

One drawback of directly modulating $f_{out}$ to emulate fractional values (i.e., averaging 30 and 31 to get 30.02) is that fractional "spurs," which are spikes in the output frequency spectrum, occur due to the periodic waveform error present in the 0.02 fractional frequency component. These spurs can be eliminated, however, by modulating $f_{out}$ using multiple values of D beyond D=30 and D=31, such as choosing D=28, 29, 30 . . . 33, with the resulting average still being 30.02. This approach reduces the (acute) noise power of a few spurs by introducing numerous further fractional spurs to the output spectrum. The noise power distribution is subsequently shared among the multitude of spurs and is thus "smoothed out" for subsequent filtering. This function is accomplished by the optional delta-sigma modulator 323 illustrated in FIG. 3c.

A further consideration is the minimum value of D. As previously discussed, the maximum possible value of D is N, and D=N corresponds to the lowest output frequency of digital frequency synthesizer 100 $f_{out}$ which is $f_{out}=f_{src}$. The minimum value of D as described in the above examples, however, is D=1. In practical applications, D is restricted to larger minimal values (say, D=24). This is due to the duty cycle of $f_{src}$ (the width of the pulse $f_{src}$, or alternatively stated, the fraction of one cycle in which $f_{src}$ is '1'). As discussed above, logic 321 only selects the next pulse when the current pulse ends. In the previous examples, it was implicitly assumed that, if the first pulse begins at 0° phase, it also ends before the very next pulse begins. For N=64, this means the pulse must end by 5.625°. This would correspond to a duty cycle of 5.625/360=1.563%, which is extremely small. In operation, $f_{src}$ may not end until 90° (when ¼ of the period is over, or duty cycle=25%). In this circumstance, not all 64 signals from the N-phase signal source 322 can be selected. In particular, with 5.625° spacing between each of the N signals, the first 16 signals cannot be selected (90°=)16*5.625°. Thus, the next signal that may be selected following the 0° signal is the 17$^{th}$ signal. Accordingly, it may be easily shown that the relationship between duty cycle, N, and D should satisfy eq. (4):

$$N*\text{Duty Cycle}(\%) \leq D_{D=an\ integer}. \quad \text{Eq. (4)}$$

For this reason, in an embodiment the duty cycle of $f_{src}$ is no more than 50%, and preferably 25%. This would give the designer the flexibility of a full (64/17)=3.76 octaves of output frequency choices.

In another embodiment, the output of final delay stage in 322 may be looped back to the first stage using an input mux that is configurable to either select fsrc to feed into the first delay stage or the loop back output from the final delay stage (after passing through an inverter). With the loop back of the final delay stage to the first stage, the delay chain may be converted to a ring oscillator, given there is 180 degree signal inversion in the loop back. The output frequency of the ring oscillator can be measured in a prescribed time period by a counter connected to the final delay stage. The counter is enabled for the prescribed time and measures the oscillation frequency of the ring oscillator. The average clock frequency of the ring oscillator can then be used to measure the delay through N stages, which in turn is used to measure the delay of a single delay stage. This calibration can be performed infrequently to estimate very closely the delay through a single delay stage in the divider (320). The measured delay through a single delay stage can be used to update the count FCW2 to accurately synthesize the desired output frequency. The purpose served by measuring the delay of a single delay stage is to be able to accurately generate the output frequency.

Figure 4:
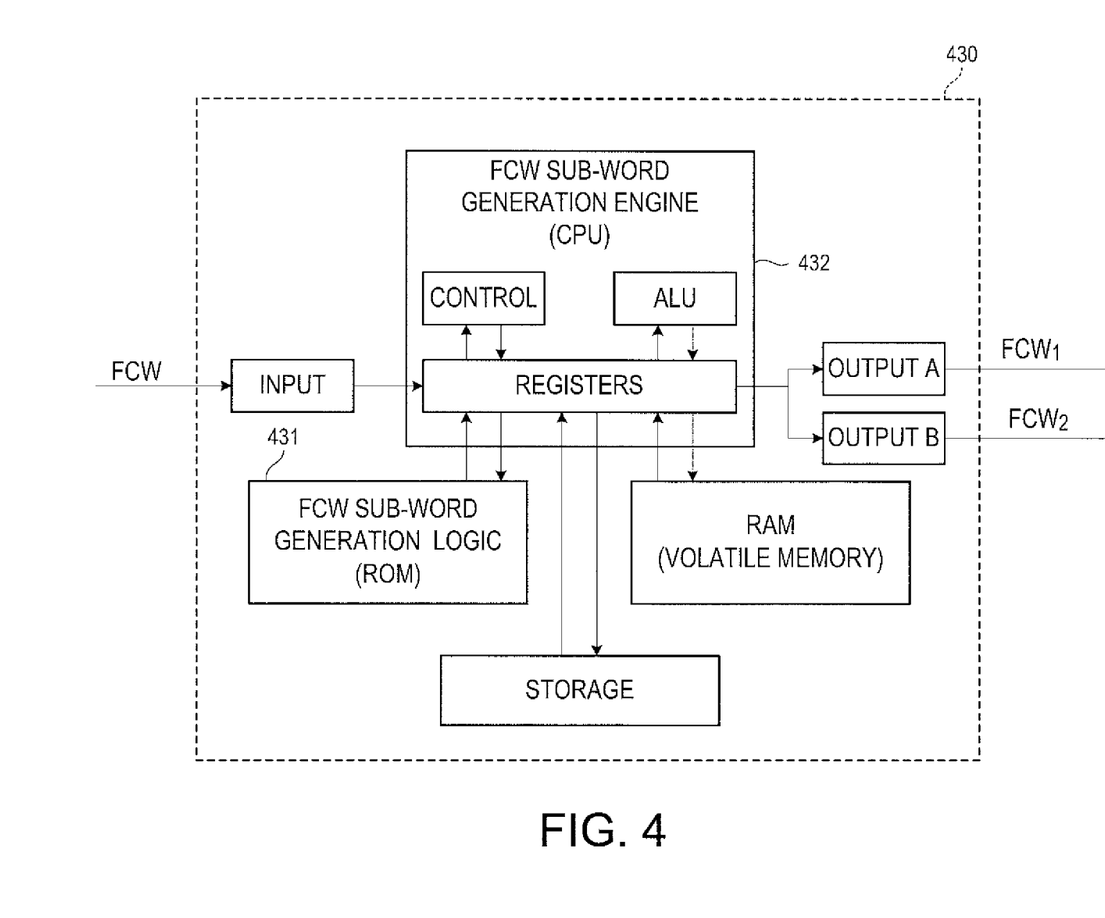
FIG. 4 shows an exemplary block diagram of a controller 430.

FIG. 4 shows a block diagram of a controller 430. The function of the controller 430 is to take the frequency control word FCW as an input, and generate frequency control sub-words FCW$_1$ and FCW$_2$ as outputs. As illustrated, the controller 430 can include a non-volatile memory 431 for storing the frequency control word generation logic or instruction set, and a computational engine 432 for executing the commands necessary to generate frequency control sub-words FCW$_1$ and FCW$_2$ from the input frequency control word FCW. In general, controller 430 may be any element or sub-system capable of executing these tasks.

Any number of different approaches may be used to generate the frequency control sub-words FCW$_1$ and FCW$_2$ from the input frequency control word FCW. Each of the frequency control word FCW and frequency control sub-words FCW$_1$ and FCW$_2$ may take the form of a decimal, hexadecimal or binary string, an analog signal value, or any other suitable form for conveying the necessary parameters to the frequency generator 110 and variable frequency divider 120. Once the frequency control word FCW has been analyzed and the necessary information extracted, the controller 430 can then execute one or more processing algorithms to correlate (or encode) this information into FCW$_1$ and FCW$_2$ in a protocol compatible with each sub-word's respective component.

Another notable aspect is that N=64 is only an example embodiment. As long as identical delay stages are used and N is selected to be large enough to contain at least one full 360 degree of the input $f_{src}$, the proposed scheme functions correctly. Hence, if one delay stage corresponds to 10 degree phase shift, at least 36 stages are needed to complete one cycle. In this embodiment, 321 works as a phase counter to select the correct phase one the rising edge of the clock and selects the next input of the multiplexer 322 at the falling edge of the clock such that the next rising edge out of 322 is the correct phase.

The digital frequency synthesizer 100 may be acting as a replacement or upgrade to an existing component in a given circuit design. In this situation, the form of the frequency control word FCW may already be set from a pre-existing component. For instance, it may be an 8-bit hex string identifying a desired output frequency. The frequency generator 110, on the other hand, may expecting an analog voltage to represent FCW$_1$, and the variable frequency divider 120 may be expecting a six-bit octal string consisting of a representing sequence that implicitly characterizes the desired output frequency. Based on these and other factors, the controller 430 may execute any combination of processes, functions, or other operations on FCW to produce FCW$_1$ and FCW$_2$. Such processes may include but are by no means limited to modulo or other arithmetic operations, look-up tables (LUTs), sequential and/or combinational logic processing, equation solving, curve fitting, extrapolation, iteration, recursion, and the like.

As an implementation example, the frequency control word FCW may be a simple M-length concatenation of sub-strings FCW$_1$ and FCW$_2$, in which case the logic of controller 430 need only transmit the first m bits to the frequency generator 110 and the second (M-m) bits to the variable frequency divider 120. Another possibility is that FCW actually is the desired output frequency in hexadecimal (i.e., FCW=B2D05E00 for a frequency $f_{out}$=3.0 GHz). In this case, FCW$_1$ and FCW$_2$ may be calculated by the controller 430 by first solving D=ROUND(64*$f_{src}/f_{out}$) for FCW$_2$, and then by taking D to solve $f_{src}=D*f_{out}/64$ for $f_{src}-2.5\% \leq f_{src} \leq f_{src}+2.5\%$ (and $f_{src}=f_{src}-2.5\%$ or $f_{src}=f_{src}+2.5\%$ outside these limits) for FCW$_1$. Yet a third possibility is that FCW simply indicates the output frequency by specifying a number in some range (say, from 1 to 1000) corresponding to the minimum and maximum output frequencies available from the digital frequency synthesizer 100, and then translated into appropriate values of FCW$_1$ and FCW$_2$.

Those skilled in the art will recognize that the above examples only demonstrate how the particular frequency values for the frequency generator 110 and variable frequency divider 120 are determined from an arbitrary frequency control word FCW. Once these values are known, the modulation (or more appropriately encoding) of FCW$_1$ and FCW$_2$ by controller 430 determines how these frequencies are actually synthesized in each component (or vice-versa). As was the case for FCW, there are multitudes of ways this may be done.

An embodiment of a possible end-to-end operation, including actual values, for the digital frequency synthesizer 100 will now be described. Assume a desired frequency of 3.14 GHz is to be generated by digital frequency synthesizer 100. This value may be represented as FCW=BB289900 (3.14×10^9 in hex). To determine D, it is first assumed that the voltage controlled oscillator (VCO) 214 center frequency and $f_{src}$ are the same, for example, 1.56 GHz. The controller 430 solves 3.14 GHz=64*1.56 GHz/D, D=31.8 and ROUND(D)=32. Accordingly, the controller 430 has determined that D=32, and the only the precise value of $f_{src}$ remains. The controller 430 now reverse-solves the same equation with D=32 to find $f_{src}$=D*$f_{out}$/64=32*3.14 GHz/64=1.57 GHz. This is within the 2.5% limits of 1.56 GHz (between 1.521 GHz and 1.6 GHz), so $f_{src}$=1.57 GHz.

In an embodiment, $FCW_1$ communicates the desired source frequency $f_{src}$ to PLL controller 212. In the present embodiment, it is assumed that $FCW_1$ will set the output frequency of some generic voltage controlled oscillator (VCO). As a design choice, it is chose to supply voltage to this VCO via a voltage divider, a set resistor, and a programmable resistor (potentiometer). It is configured to scale the resistors such that, for the programmable resistor, 0Ω→$f_{src}$−2.5% and 10 kΩ→$f_{src}$+2.5%. For $f_{src}$=1.57 GHz, this means the programmable resistor value=6.25kΩ. This will be the value of $FCW_1$ (in hex), so $FCW_1$=186A.

To illustrate a different way of conveying values in the frequency control sub-words, we will choose a second (different) scheme for $FCW_2$. A first observation is that D=32 is half of N=64, and thus $f_{out}$=(64/32)*$f_{src}$=2*$f_{src}$. If we choose $f_{src}$ at 0° for the first signal from the N-phase signal source 322, the second signal to be applied immediately after the pulse from $f_{src}$ at 0° must be $f_{src}$ at 180° in order to get 2 signals per cycle (2*$f_{src}$). These 2 signals are separated by 31 other unused signals in the N-phase signal source 322. Thus, one way to select the proper addresses from element 322 to achieve this output frequency is to always add 32 (in hex) to the address of the current signal (and drop the rollover, or "carry"). Thus, $FCW_2$ could just be the value to be added to the current signal address following each pulse, i.e., $FCW_2$=0020 (32 in hex). This is the same concept as adding 6 hours to a clock following each pulse—no matter what the actual time is on the clock (3:42:19 PM), it will result in creating pulses twice per cycle, equally spaced in time.

The motivation for implementing the above methods and further variations thereof are numerous, but the chief reason is adaptability and/or compatibility with existing components. For example, designing $FCW_2$ around an 8-bit addressing scheme eliminates or at least discourages implementation in, for example, applications with a standard universal 32-bit addressing scheme. Moreover, offering a variety of implementation protocols makes unforeseen obstacles easier to tackle. For example, a 2-bit adder cannot take 8-bit addresses, but can be made to work on the principle of adding even vs. odd '1' values. Accordingly, in this circumstance it may become practical to format $FCW_2$ on the basis of concatenated even and odd valued strings.

Figure 5:
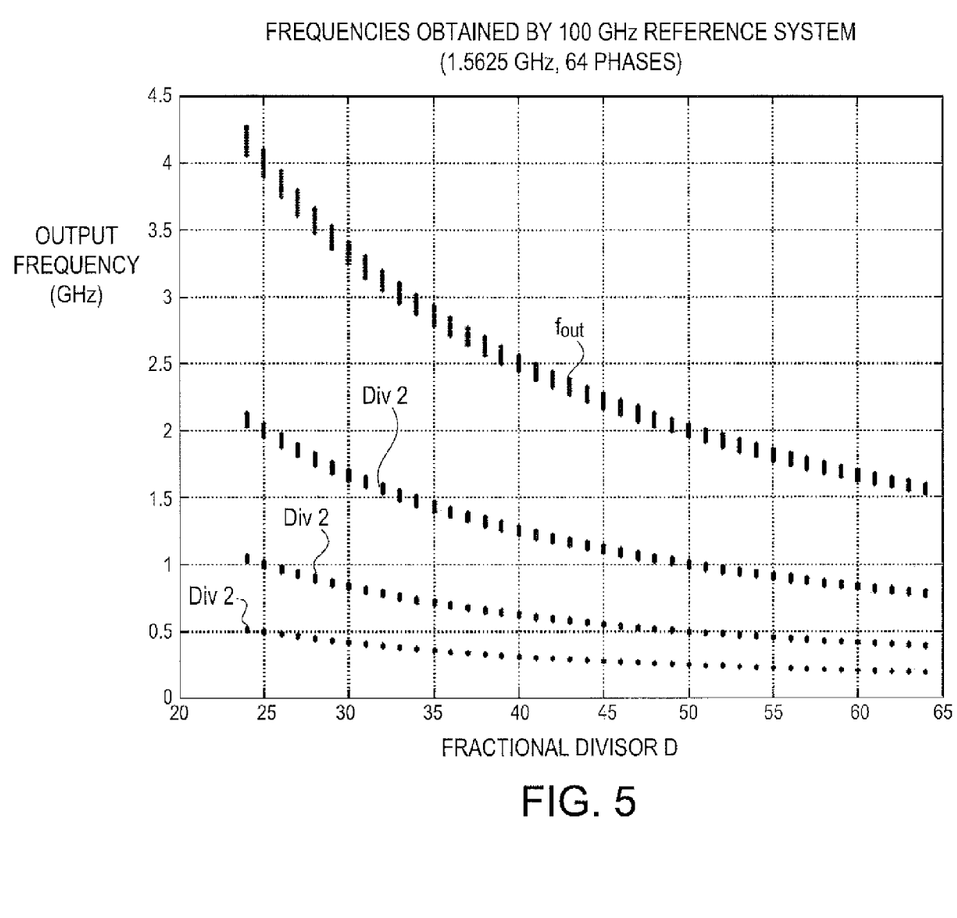
FIG. 5 shows a graph of an output frequency spectrum of a digital frequency synthesizer as a function of a fractional divisor.

FIG. 5 illustrates an exemplary output of the digital frequency synthesizer 100. In FIG. 5, the trend-line labeled $f_{out}$ represents a voltage controlled oscillator (VCO) operating with a center frequency of 1.5625 GHz (accordingly, $f_{src}$ 1.5625 GHz+/−5%), and N=64. The division ratio (x-axis) corresponds to the integer value of D, and thus to the data represented in $FCW_2$. The spread in each data "line" indicates that $f_{src}$ may be tuned up or down by, for example, 2.5% as specified by $FCW_1$. Hence, for D=25, we observe the center frequency of the digital frequency synthesizer output $f_{out}$=(64)*(1.5625)/(25)=4 GHz, with an upper bound of (64)*(1.5625*1.025)/(25)=4.1 GHz and a lower bound of (64)*(1.5625*0.975)/(25)=3.9 GHz.

FIG. 5 demonstrates that digital frequency synthesizer 100 is capable of outputting a continuous wide-band spectrum for N=64 with 1.5625 GHz≤$f_{out}$≤4.27 GHz. FIG. 5 also indicates that further divide-by-2 stages can be employed to lower $f_{out}$ to ~200 MHz or lower output frequencies, depending on the necessary clock speed for a given application.

Figure 6:
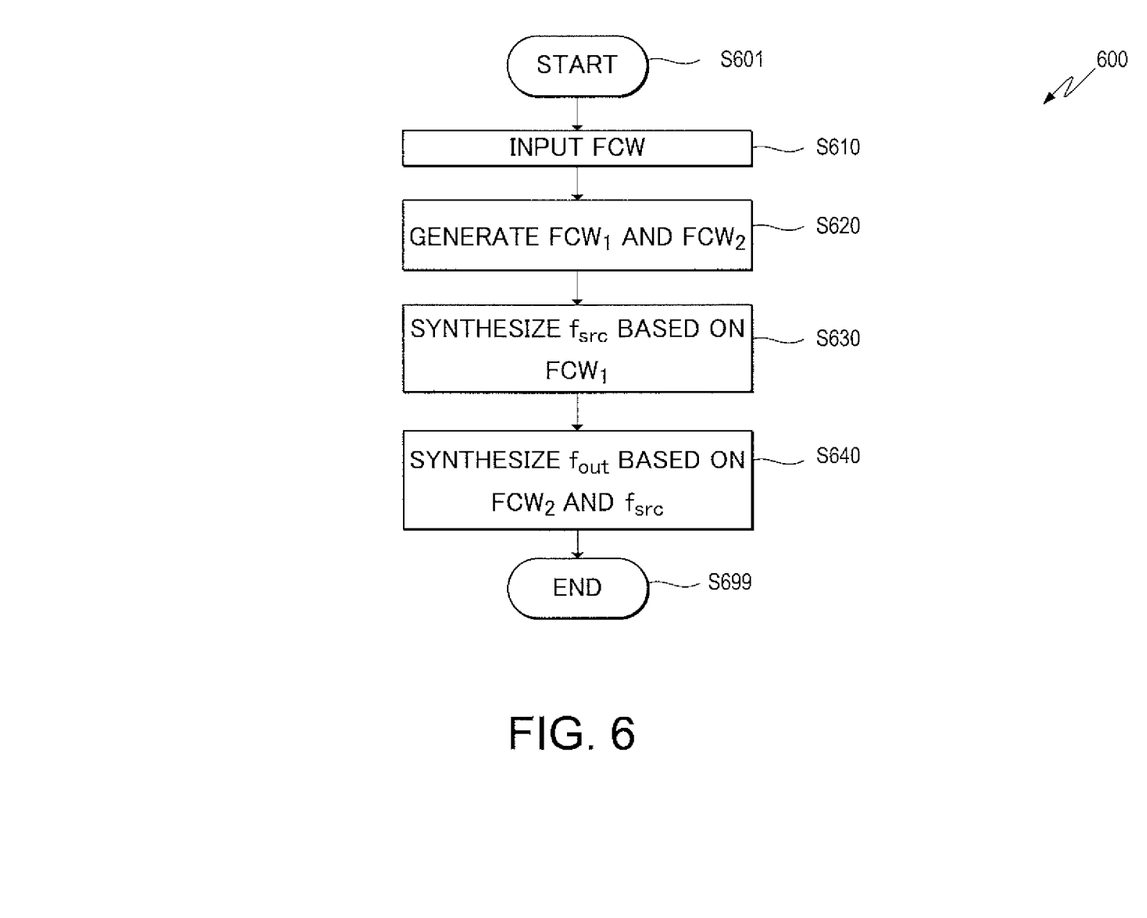
FIG. 6 is a flowchart illustrating the steps involved in performing an exemplary digital frequency synthesis process according to an embodiment of the disclosure.

FIG. 6 is a flowchart outlining an exemplary digital signal synthesizing process 600. The process begins at step 601 and proceeds to step 610 where a frequency code word FCW is received. For example, with reference to FIG. 1, a FCW is received by the controller 130 from the data source 105. As described above, the FCW can be represented as a hexadecimal string, and may have been encoded in numerous different ways. For example, FCW may be expressing $f_{out}$ directly in value. Alternatively, $FCW_1$ and $FCW_2$ may have been chosen/designed such that the original FCW turns out to be a simple concatenation of each ($FCW_1 \cup FCW_2$). Control then proceeds to step 620.

In step 620, first and second frequency control sub-words $FCW_1$ and $FCW_2$ are generated. As described above, the first and second frequency control sub-word can be generated by first extracting the desired individual frequencies $f_{src}$ and $f_{out}$ destined for the frequency generator 110 and variable frequency divider 120, respectively, and then by applying any suitable encoding scheme sufficient to convey what precise frequency $f_{src}$ and $f_{out}$ each should respectively generate. In an embodiment, the range of viable output frequencies for the frequency generator 110 and variable frequency divider 120 may be divided into $2^N$ steps from lowest to highest, and $FCW_1$ and $FCW_2$ simply indicate some value between 0 and $2^N$ indicative of the desired output value. Control then passes to step 630.

In step 630, a source frequency $f_{src}$ is generated based on the first frequency control sub-word $FCW_1$. As described above, the source frequency can be generated by a frequency generator by specifying a resistor value corresponding to a driving VCO voltage level resulting in the generation of a specific frequency.

In step 640 $f_{out}$ is generated based on the second frequency control sub-word $FCW_2$ and the source frequency. For example, with reference to FIG. 3, the output frequency can be generated by a variable frequency divider 120 by applying a sequence of different signals from an N-phase signal source 322 to a logic 321.

Control then proceeds to step 699 where the process is terminated.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A digital frequency synthesizer, comprising:
   a controller configured to receive a frequency control word and generate a first frequency control sub-word and a second frequency control sub-word based on the frequency control word;
   a frequency generator configured to generate a source frequency within a first predetermined frequency range based on the first frequency control sub-word; and
   a variable frequency divider configured to generate an output frequency within a second predetermined frequency range based on the second frequency control sub-word and the source frequency, wherein the first predetermined frequency range is defined as + or −X % of the source frequency $f_{src}$,
the second predetermined frequency range is defined by $(64*f_{src}−f_{src})$, and
a ratio of the second predetermined frequency range to the first predetermined frequency range is $(64*f_{src}−f_{src})/(f_{src}+ or −X \%)=31.5/X \%$.

2. The digital frequency synthesizer of claim 1, wherein the frequency generator comprises a phase-locked loop (PLL) controller and a tunable oscillator.

3. The digital frequency synthesizer of claim 1, wherein the first predetermined frequency range is no more than 5% of a center frequency generated by the frequency generator.

4. The digital frequency synthesizer of claim 3, wherein the frequency generator exhibits a quality factor Q of at least 20.

5. The digital frequency synthesizer of claim 2, wherein the frequency generator generates the source frequency based on an input of an external oscillator.

6. The digital frequency synthesizer of claim 1, wherein the variable frequency divider comprises logic and an N-phase signal source, and the N-phase signal source further comprises a multiplexer and N phase-delaying elements, and the logic comprises a positive-edge triggered unit delay element and a negative-edge triggered unit delay element.

7. The digital frequency synthesizer of claim 6, wherein the output frequency is defined by $f_{out}=N*f_{src}/D$, where N is an integer determined by the N-phase signal source, and D is an integer between 1 and N.

8. The digital frequency synthesizer of claim 1, wherein the controller comprises a memory to store the frequency control sub-word generation instructions, and a processor to execute the frequency control sub-word generation instructions.

9. The digital frequency synthesizer of claim 1, wherein at least one frequency control sub-word is determined by performing at least one arithmetic, logic, or look-up operation on the frequency control word.

10. A method for performing digital frequency synthesis, the method comprising:
    receiving a frequency control word;
    generating at least two frequency control sub-words based on the frequency control word;
    instructing a frequency generator to generate a source frequency within a first predetermined frequency range based on a first frequency control sub-word; and
    instructing a variable frequency divider to generate an output frequency within a second predetermined frequency range based on a second frequency control sub-word and the source frequency, wherein
    the first predetermined frequency range is defined as + or −X % of the source frequency $f_{src}$,
    the second predetermined frequency range is defined by $(64*f_{src}−f_{src})$, and
    a ratio of the second predetermined frequency range to the first predetermined frequency range is $(64*f_{src}−f_{src})/(f_{src}+ or −X \%)=31.5/X \%$.

11. The digital frequency synthesis method of claim 10, the method further comprising:
    tuning a tunable oscillator over the first predetermined frequency range, the first predetermined frequency range being no more than 5% of a center frequency generated by the tunable oscillator.

12. The digital frequency synthesis method of claim 10, the method further comprising:
    supplying an external reference frequency to the frequency generator.

13. The digital frequency synthesis method of claim 10, the method further comprising:
    generating an output frequency according to $f_{out}=N*f_{src}/D$, where N is an integer determined by an N-phase signal source, and D is an integer between 1 and N.

14. The digital frequency synthesis method of claim 10, the method further comprising:
    performing at least one arithmetic, logic, or look-up operation on the frequency control word to generate each frequency control sub-word.

15. An electronic device having a digital frequency synthesizer, comprising:
    a controller configured to receive a frequency control word and generate a first frequency control sub-word and a second frequency control sub-word based on the frequency control word;
    a frequency generator configured to generate a source frequency within a first predetermined frequency range based on the first frequency control sub-word; and
    a variable frequency divider configured to generate an output frequency within a second predetermined frequency range based on the second frequency control sub-word and the source frequency, wherein:
    the first predetermined frequency range is defined as + or −X % of the source frequency $f_{src}$,
    the second predetermined frequency range is defined by $(64*f_{src}−f_{src})$, and
    a ratio of the second predetermined frequency range to the first predetermined frequency range is $(64*f_{src}−f_{src})/(f_{src}+ or −X \%)=31.5/X \%$.

16. The electronic device of claim 15, wherein the frequency generator comprises a phase-locked loop (PLL) controller and a tunable oscillator.

17. The electronic device of claim 15, wherein the variable frequency divider comprises logic and a N-phase signal source, the N-phase signal source comprises a multiplexer and N phase-delaying elements, and the logic comprises a positive-edge triggered unit delay element and a negative-edge triggered unit delay element.

18. The electronic device of claim 17, wherein the output frequency is defined by $f_{out}=N*f_{src}/D$, where N is an integer determined by the N-phase signal source, and D is an integer between 1 and N.

* * * * *